(12) United States Patent
Ono et al.

(10) Patent No.: US 6,347,046 B1
(45) Date of Patent: Feb. 12, 2002

(54) CURRENT DRIVER CIRCUIT WITH A DAMPING CIRCUIT

(75) Inventors: Akihiko Ono; Susumu Ozaki, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/621,582

(22) Filed: Jul. 21, 2000

(30) Foreign Application Priority Data

Sep. 17, 1999 (JP) .......................................... 11-263673

(51) Int. Cl.[7] .......................... H02M 1/12; H02M 1/14; H02M 7/5387
(52) U.S. Cl. .......................... 363/132; 363/134; 363/41; 363/98
(58) Field of Search .............................. 363/40, 41, 95, 363/98, 131, 132, 134

(56) References Cited

U.S. PATENT DOCUMENTS

| | | | | |
|---|---|---|---|---|
| 4,328,525 A | * | 5/1982 | Allen et al. .................. | 361/152 |
| 5,333,081 A | * | 7/1994 | Mitsui ........................... | 360/46 |
| 5,357,379 A | * | 10/1994 | Gower .......................... | 360/46 |
| 5,363,249 A | | 11/1994 | Fitzmorris .................... | 340/46 |
| 5,880,626 A | * | 3/1999 | Dean ............................ | 327/552 |
| 6,128,146 A | * | 10/2000 | Ngo .............................. | 360/46 |

FOREIGN PATENT DOCUMENTS

JP          3-59805         3/1991     ............ G11B/5/09

* cited by examiner

*Primary Examiner*—Bao Q. Vu
(74) *Attorney, Agent, or Firm*—Arent Fox Kintner Plotkin & Kahn, PLLC

(57) ABSTRACT

A current driver circuit for writing data to a hard disk receives an input signal and generates a current for driving a load. A drive circuit supplies the load with a current. A damping circuit connected to the drive circuit restricts the current supplied to the load in accordance with a pulse signal. A damping control signal connected to the damping circuit generates the pulse signal in response to the input signal and provides the pulse signal to the damping circuit.

10 Claims, 5 Drawing Sheets

CURRENT DRIVER CIRCUIT WITH A DAMPING CIRCUIT

BACKGROUND OF THE INVENTION

The present invention relates to a current driver circuit, and more particularly, to a current driver circuit that is optimal for a write coil driver of, for example, a hard disk drive (HDD) device.

In a current driver circuit, when driver switching is performed, the load of the current driver circuit or the inductive load (coil component) included in the line between the driver circuit and the load results in the generation of a flyback voltage. The flyback voltage causes overshooting and ringing of the output current. To prevent or decrease overshooting and ringing, a damping circuit is included in the current driver circuit. The switching speed of the current driver circuit has become faster. Accordingly, there is a demand for a damping circuit that smoothes the output waveform of the current driver circuit without decreasing the switching speed of the current driver circuit.

FIG. 1 is a schematic circuit diagram showing a first example of a prior art current driver circuit for driving a write magnetic head of an HDD device. The current driver circuit 50 includes a pair of drive sections (inverter circuits) 51, 52. A load circuit 53 formed by a write coil (the write magnetic head) is connected between an output terminal 51a of the first drive section 51 and an output terminal 52a of the second drive section 52.

When recording data on a track of a magnetic disk via the write magnetic head, a first input signal Vi1 is provided to an input terminal 51b of the first drive section 51. A second input signal Vi2 is provided to an input terminal 52b of the second drive section 52. As shown in FIG. 2, the first and second input signals Vi1, Vi2 are complementary. When one of the signals Vi1, Vi2 has a positive high potential voltage (high level), the other one of the signals Vi1, Vi2 has a low potential voltage (low level).

When the first input signal Vi1 is low and the second input signal Vi2 is high, an output voltage Vo1 from the first drive section 51 has a high potential, and an output voltage Vo2 from the second drive section 52 has low potential. Accordingly, an output current Io flows from the first drive section 51 to the second drive section 52 in the load circuit 53.

On the other hand, when the first input signal Vi1 is high and the second input signal Vi2 is low, the output voltage Vo2 from the second drive section 52 has a high potential, and the output voltage Vo1 from the first drive section 51 has low potential. Accordingly, the output current Io flows from the second drive section 52 to the first drive section 51. The direction of the output current Io flowing through the load circuit 53 changes the magnetized direction of the magnetic disk and records data on the track.

The load circuit 53 includes an inductive impedance (reactance) component. Thus, a flyback voltage is generated at the output terminals 51a, 52a when the current driver circuit 50 performs switching (when the levels of the first and second input signals Vi1, Vi2 are shifted). As shown in FIG. 2, the flyback voltage results in the occurrence of overshooting and undershooting in the waveform of the output current Io flowing through the load circuit 53. Further, since the capacitance, resistance, and impedance components of the inductance in the current driver circuit 50, the load circuit 53, and the line cause ringing, a smooth current waveform cannot be obtained.

A damping circuit 55 is thus provided in the current driver circuit 50. The damping circuit 55 includes a capacitance C1 and a resistor R1 connected in series between the output terminals 51a and 52a. The differential voltage (Vo1–Vo2) between the output terminals 51a, 52a changes in accordance with a frequency determined by a time constant corresponding to the capacitance C1 and the resistor R1. In such state, only the high frequency components of the differential voltage are bypassed via the damping circuit 55 to shape the output current Io flowing through the load circuit 53.

However, in the damping circuit 55 of FIG. 1, when the differential voltage between the output terminals 51a, 52a fluctuates, the frequency of the fluctuation activates the is damping circuit 55 and rounds the waveform of the output current Io. This hinders high speed switching operation. Thus, the setting of the damping frequency becomes especially difficult when the switching speed increases.

FIG. 3 is a schematic circuit diagram showing a second example of a prior art current driver circuit 60. The current driver circuit 60 includes a first damping circuit 56A having a pair of resistors R2 connected to the output terminal 51a, and a second damping circuit 56B having a pair of resistors R2 connected to the output terminal 52a. The output terminals 51a, 52a are each connected to a positive power supply and the ground by the associated pair of resistors R2. The resistors R2 have a relatively low resistance, and the output terminals 51a, 52a are terminated with a relatively low impedance. Accordingly, the occurrence of ringing in the output current Io flowing through the load circuit 53 is inhibited.

In the damping circuits 56A, 56B of FIG. 3, the output terminals 51a, 52a are connected to the positive power supply and the ground by the associated pair of resistors R2. The output current Io thus constantly flows through the damping circuits 56A, 56B, which causes a large power loss.

FIG. 4 is a schematic circuit diagram showing a third example of a prior art current driver circuit 70. The current driver circuit 70 includes a first damping circuit 57A having a series-connected circuit formed by a plurality of diodes D3 and a resistor R3, and connected to the output terminal 51a, and a second damping circuit 57B having a series-connected circuit formed by a plurality of diodes D3 and a resistor R3, and connected to the output terminal 52a. The damping circuits 57A, 57B are each activated when the flyback voltage causes the associated output voltages Vo1, Vo2 to be less than a predetermined voltage. The activation restricts the output current Io and thus decreases the overshooting of the current waveform and shapes the waveform of the output current Io flowing through the load circuit 53.

Since the damping circuits 57A, 57B of FIG. 4 are activated by the waveform of the flyback voltage, the power loss is small. However, the ON voltage of the damping circuits 57A, 57B must be set so that damping is performed when the damping circuits 57A, 57B are activated. Further, it is difficult to perform damping efficiently within the minimum period of time. Thus, it is difficult to perform waveform shaping at a high speed during high speed switching operations.

SUMMARY OF THE INVENTION

It is an object of the present invention to provide a current driver circuit that smoothly controls the output current waveform while achieving a high switching speed.

To achieve the above object, the present invention provides a current driver circuit for receiving an input signal and current driving a load. The current driver circuit includes a drive circuit for supplying the load with current.

A damping circuit is connected to the drive circuit for restricting the current supplied to the load from the drive circuit in accordance with a pulse signal. A damping control circuit is connected to the damping circuit for generating the pulse signal in response to the input signal and providing the pulse signal to the damping circuit.

A further aspect of the present invention provides a differential current driver circuit for receiving first and second input signals and current driving a load. The differential current driver circuit includes a first drive circuit for supplying the load with a first current. A first damping circuit is connected to the first drive circuit for restricting the first current supplied to the load from the first drive circuit in accordance with a first pulse signal. A first damping control circuit is connected to the first damping circuit for generating the first pulse signal in response to the first input signal and providing the first pulse signal to the first damping circuit. A second drive circuit supplies the load with a second current. A second damping circuit is connected to the second drive circuit for restricting the second current supplied to the load from the second drive circuit in accordance with a second pulse signal. A second damping control circuit is connected to the second damping circuit for generating the second pulse signal in response to the second input signal and providing the second pulse signal to the second damping circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 5:
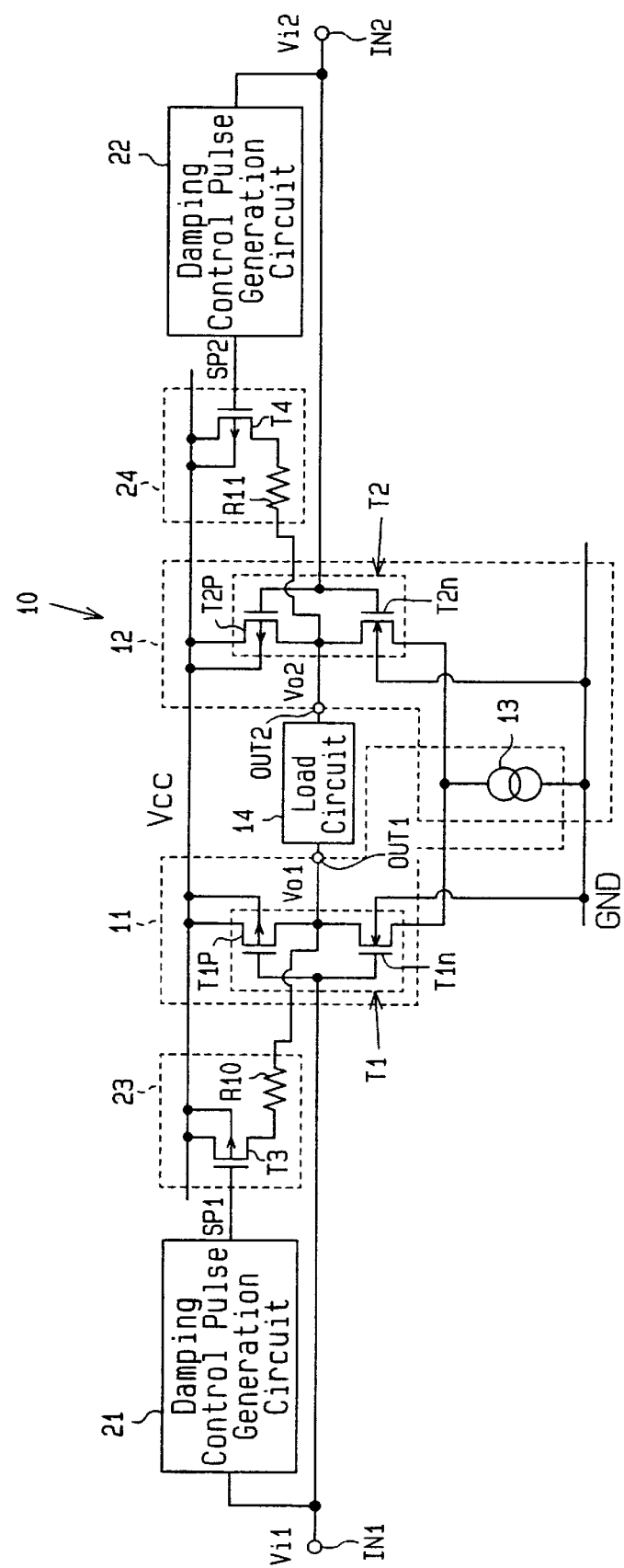
FIG. 5 is a schematic circuit diagram showing a current driver circuit according to a first embodiment of the present invention.

FIG. 5 is a schematic circuit diagram showing a current driver circuit according to a first embodiment of the present invention. The current driver circuit 10 is used to drive a write magnetic head of a HDD device and is a differential current driver circuit operated by the difference between two input signals.

The current driver circuit 10 includes first and second drive circuits 11, 12, first and second damping control pulse generation circuits (hereafter referred to as damping control circuits) 21, 22, and first and second damping circuits 23, 24.

The first drive circuit 11 includes a CMOS transistor T1, which is formed by a p-channel MOS transistor T1$p$, an n-channel MOS transistor T1$n$, and a constant current circuit 13. The source terminal and the back gate terminal of the PMOS transistor T1$p$ are connected to a positive power supply voltage Vcc. The back gate terminal of the NMOS transistor T1$n$ is connected to the ground GND. The source terminal of the NMOS transistor T1$n$ is connected to the ground GND via the constant current circuit 13.

The second drive circuit 12 includes a CMOS transistor T2, which is formed by a p-channel MOS transistor T2$p$, an n-channel MOS transistor T2$n$, and the constant current circuit 13. The source terminal and the back gate terminal of the PMOS transistor T2$p$ are connected to the positive power supply voltage Vcc. The back gate terminal of the NMOS transistor T2$n$ is connected to the ground GND. The source terminal of the NMOS transistor T2$n$ is connected to the ground GND via the constant current circuit 13. Thus, current flows to the same constant current circuit 13 from both of the NMOS transistors T1$n$, T2$n$.

A load circuit 14 formed by a write coil (write magnetic head), which serves as an inductive load, is connected between a first output terminal OUT1 of the first drive circuit 11 (the output terminal of the CMOS transistor T1) and a second output terminal OUT2 of the second drive circuit 12 (the output terminal of the CMOS transistor T2).

Figure 7:
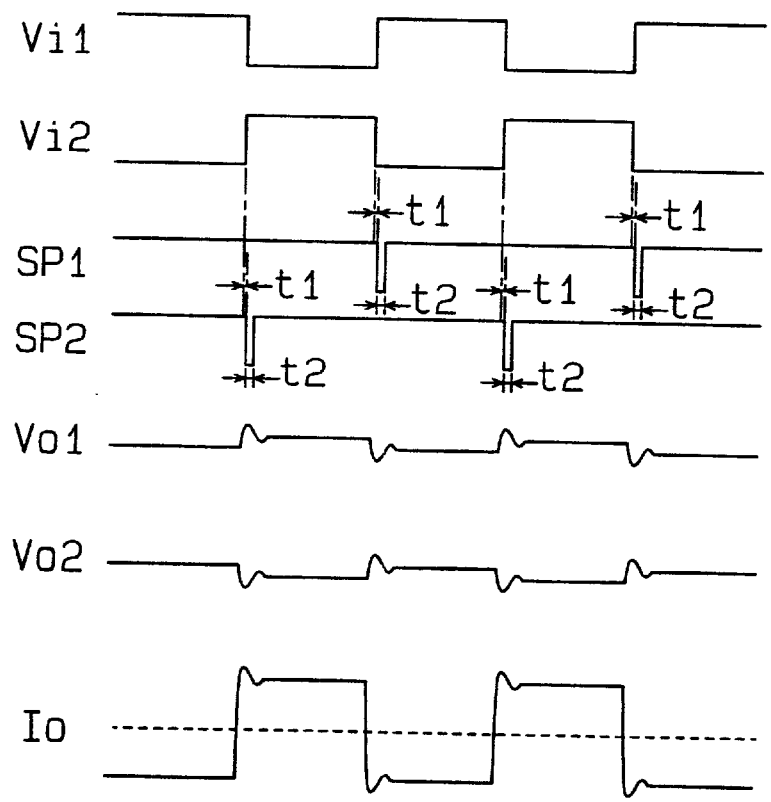
FIG. 7 is a waveform diagram illustrating the operation of the current driver circuit of FIG. 5.

A first input signal Vi1 is provided to a first input terminal IN1 of the first drive circuit 11 (the input terminal of the CMOS transistor T1). A second input signal Vi2 is provided to a second input terminal IN2 of the second drive circuit 12 (the input terminal of the CMOS transistor T2). As shown in FIG. 7, the first and second input signals Vi1, Vi2 are complementary. When one of the signals Vi1, Vi2 has a positive high potential voltage (high level), the other one of the signals Vi1, Vi2 has a low potential voltage (low level).

When the first input signal Vi1 is low and the second input signal Vi2 is high, the PMOS transistor T1$p$ and the NMOS transistor T2$n$ are activated, and the PMOS transistor T2$p$ and the NMOS transistor T1$n$ are deactivated. Accordingly, a current Io flows from the first drive circuit 11 to the second drive circuit 12 in the load circuit 14.

On the other hand, when the first input signal Vi1 is high and the second input signal Vi2 is low, the PMOS transistor T2$p$ and the NMOS transistor T1$n$ are activated, and the PMOS transistor T1$p$ and the NMOS transistor T2$n$ are deactivated. Accordingly, a current Io flows from the second drive circuit 12 to the first drive circuit 11 in the load circuit 14.

Figure 6:
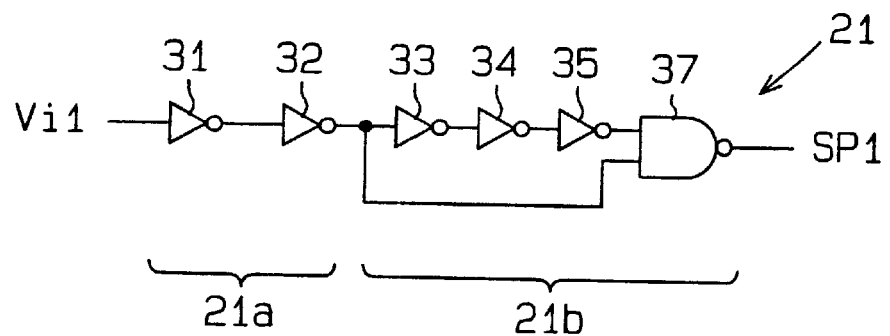
FIG. 6 is a schematic circuit diagram showing first and second damping control pulse generation circuits of the current driver circuit of FIG. 5.

With reference to FIG. 6, the first damping control circuit 21 includes a pulse delay circuit 21$a$ and a pulse generation circuit 21$b$. The pulse delay circuit 21$a$ includes a plurality of inverter circuits 31, 32 (in this embodiment, two). The pulse delay circuit 21$a$ receives the first input signal Vi1 and delays the first input signal Vi1 by a delay time t1, which is determined by the delaying operation of the inverter circuits 31, 32. The delayed first input signal Vi1 is provided to the pulse generation circuit 21$b$.

The pulse generation circuit 21$b$ includes a plurality of inverter circuits 33, 34, 35 (in this embodiment, three) and a NAND circuit 37. A first input terminal of the NAND circuit 37 is provided with the delayed first input signal Vi1 via the inverter circuits 33, 34, 35. Accordingly, when the delayed first input signal Vi1 goes high, an output signal (first damping control signal) SP1 generated by the NAND circuit 37 goes low. The first damping control signal SP1 then goes high after a delay time t2 determined by the delaying operation of the inverter circuits 33, 34, 35 elapses.

Therefore, when the first input signal Vi1 rises, the first damping control signal SP1 falls after the delay time t1 elapses and then rises after the delay time t2 elapses. In this manner, a pulse signal having a pulse width corresponding to the delay time t2 is generated by the first and second damping circuits 23, 24 after the delay time t1 elapses from when transition of the input signal Vi1 occurs. The delay times t1, t2 are set at a predetermined time that decreases the overshooting of the output current Io.

The second damping control circuit 22 is substantially identical to the first damping control circuit 21 and includes a pulse delay circuit 22a and a pulse generation circuit 22b. The second damping control circuit 22 differs from the first damping control circuit 21 only in that the second input signal Vi2 is input and a second damping control signal SP2 is generated. Thus, the pulse delay circuit 22a and the pulse generation circuit 22b will not be described.

When the second input signal Vi2 rises, the second damping control signal SP2 falls after the delay time t1 elapses and then rises after the delay time t2 elapses. That is, a pulse signal having a pulse width corresponding to the time t2 is generated after the delay time t1 elapses from when transition of the input signal Vi2 occurs.

The first damping circuit 23 includes a p-channel MOS transistor T3 and a resistor R10. The PMOS transistor T3 has a source terminal and a back gate terminal connected to the positive power supply voltage Vcc and a drain terminal connected to the first output terminal OUT1 via the resistor R10. A gate terminal of the PMOS transistor T3 is provided with the first damping control signal SP1 from the first damping control circuit 21.

The PMOS transistor T3 is activated when the first damping control signal SP1 goes low. More particularly, after the delay time t1 elapses from when the first input signal Vi1 rises, the PMOS transistor T3 is activated for the delay time t2. In this state, the high first input signal Vi1 deactivates the PMOS transistor T1p of the first drive circuit 11 and activates the NMOS transistor T1n of the first drive circuit 11.

The second damping circuit 24 includes a p-channel MOS transistor T4 and a resistor R11. The PMOS transistor T4 has a source terminal and a back gate terminal connected to the positive power supply voltage Vcc and a drain terminal connected to the second output terminal OUT2 via the resistor R11. A gate terminal of the PMOS transistor T4 is provided with the second damping control signal SP2 from the second damping control circuit 22.

The PMOS transistor T4 is activated when the second damping control signal SP2 goes low. More particularly, after the delay time t1 elapses from when the second input signal Vi2 rises, the PMOS transistor T4 is activated for the delay time t2. In this state, the high second input signal Vi2 deactivates the PMOS transistor T2p of the second drive circuit 12 and activates the NMOS transistor T2n of the second drive circuit 12.

The operation of the current driver circuit 10 will now be described with reference to FIG. 7.

Assuming that the first input signal Vi1 provided to the first drive circuit 11 is high and the second input signal Vi2 provided to the second drive circuit 12 is low, the PMOS transistor T2p and the NMOS transistor T1n are activated, and the PMOS transistor T1p and the NMOS transistor T2n are deactivated. Accordingly, the current Io in the load circuit 14 flows toward the first drive circuit 11 from the second drive circuit 12.

Then, when the first input signal Vi1 goes low and the second input signal Vi2 goes high, the PMOS transistor T1p and the NMOS transistor T2n are activated, and the PMOS transistor T2p and the NMOS transistor T1n are deactivated. Accordingly, the current Io in the load circuit 14 flows toward the second drive circuit 12 from the first drive circuit 11. At this signal transition timing, the first and second damping control signals SP1, SP2 of the respective first and second damping control circuits 21, 22 are maintained at a high level. Thus, neither the first nor second damping circuit 23, 24 is activated. Accordingly, the output current Io changes at a high speed.

After the delay time t1 elapses from when the second input signal Vi2 goes high, the damping control signal SP2 falls and then rises when the delay time t2 elapses. That is, the damping control signal SP2 goes low when the output current Io overshoots. This activates the PMOS transistor T4 of the damping circuit 24 and supplies current to the output terminal OUT2 via the resistor R11 from the high potential power supply. This restricts the current Io flowing through the load circuit 14. That is, since the current flowing through the constant current circuit 13 is constant, the current supplied from the damping circuit 24 restricts the output current Io that flows through the load circuit 14. As a result, overshooting of the output current Io is inhibited. Further, since the second damping control signal SP2 goes high again after the delay time t2 elapses and impedes the supply of current to the output terminal OUT2 from the damping circuit 24, the desired current Io flows through the load circuit 14.

Then, when the first input signal Vi1 shifts to a high level and the second input signal Vi2 shifts to a low level, the PMOS transistor T2p and the NMOS transistor T1n are activated, and the PMOS transistor T1p and the NMOS transistor T2n are deactivated. Accordingly, the current Io in the load circuit 14 flows from the second drive circuit 12 to the first drive circuit 11. At this transition timing, neither the first nor second damping circuit 23, 24 is activated since the first and second damping control signals SP1, SP2 are both maintained at a high level. Thus, the output current Io changes at a high speed.

After the delay time t1 elapses from when the first input signal Vi1 goes high, the damping control signal SP1 falls and then rises when the delay time t2 elapses. That is, the first damping control signal SP1 goes low when the output current Io overshoots. This activates the PMOS transistor T3 of the damping circuit 23 and supplies current to the output terminal OUT1 via the resistor R10 from the high potential power supply. Thus, the current Io flowing through the load circuit 14 is restricted and overshooting of the output current Io is inhibited. Further, since the first damping control signal SP1 goes high again after the delay time t2 elapses and impedes the supply of current to the output terminal OUT1 from the damping circuit 23, the desired current Io flows through the load circuit 14.

Figure 1:
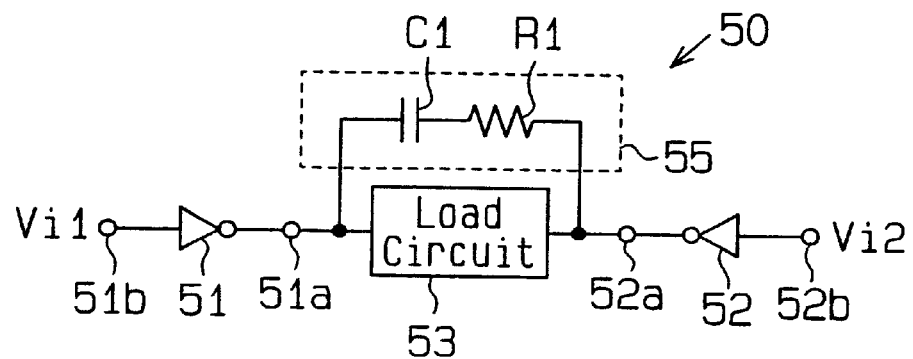
FIG. 1 is a schematic circuit diagram showing a first example of a prior art current driver circuit.
Figure 2:
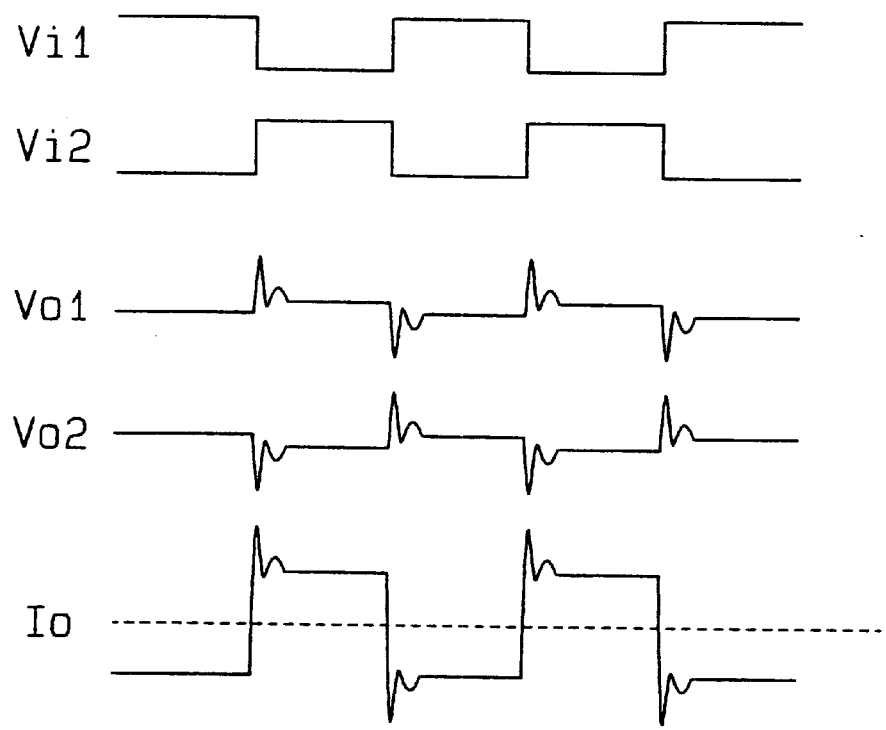
FIG. 2 is a waveform diagram illustrating the operation of the current driver circuit of FIG. 1.
Figure 3:
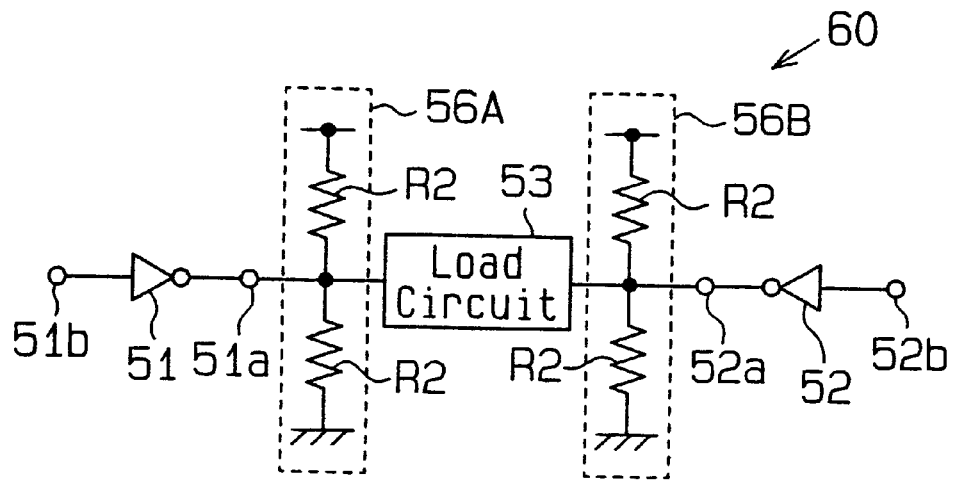
FIG. 3 is a schematic circuit diagram showing a second example of a prior art current driver circuit.
Figure 4:
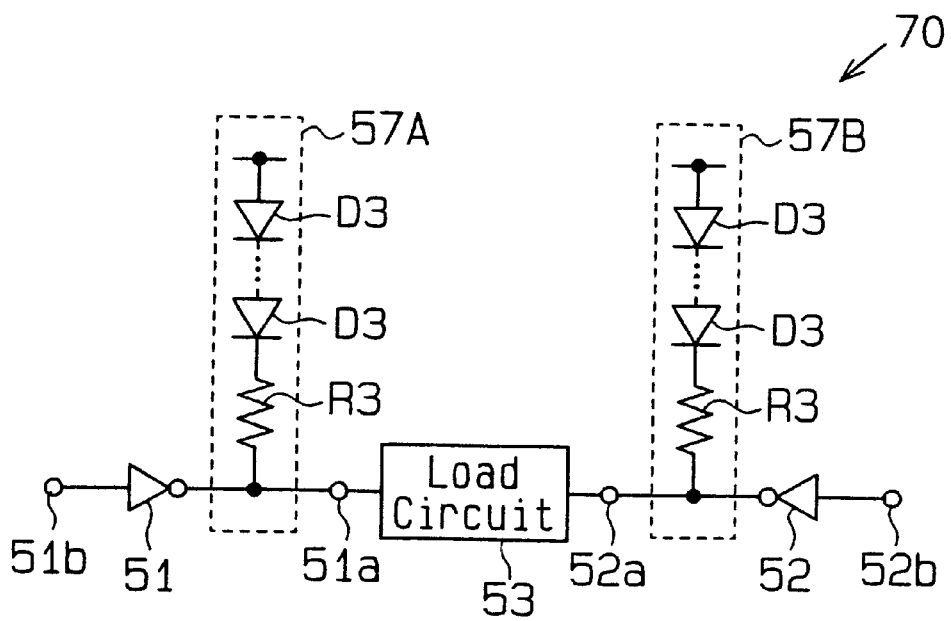
FIG. 4 is a schematic circuit diagram showing a third example of a prior art current driver circuit.

If the first and second damping circuits 23, 24 were to be omitted, a counter electromotive force (flyback voltage), such as that shown in FIG. 2, would be generated during transition of the input signals Vi1, Vi2, or when switching is performed in the drive circuits 11, 12.

By representing the reactance component of the load circuit 14 with L, the counter electromotive force dV is expressed by:

$$dV = -L \cdot dIo/dt.$$

The equation represents the optimal current switching, and an infinite counter electromotive force dV would be generated if there were no impedance components except for L.

Actually, since the parasitic resistance and capacitance components of the line exist, the counter electromotive force dV generated during the switching of the current driver circuit 10 cannot be easily described. However, the counter electromotive force dV increases as the switching speed increases, the current becomes greater, and the reactance L of the load circuit 14 becomes greater. The voltage that overshoots due to the counter electromotive force dV may generate ringing depending on the circuit constant formed by the impedance that includes the resistance and capacitance components. Accordingly, the damping effect of the damping circuits 23, 24 inhibits overshooting of the output current Io caused by the flyback voltage.

If the damping circuits 23, 24 are constantly operated and the amplitude of the counter electromotive force dV is forcibly over-inhibited, the switching speed of the output current Io may be affected. That is, in the damping circuits 55, 56A, 56B, 57A, 57B of the prior art current driver circuits 50, 60, 70, it is difficult to perform waveform shaping that inhibits overshooting while achieving a high switching speed. In comparison, in the current driver circuit 10 of the present embodiment, the activation of the damping circuits 23, 24 only when the output current Io reaches its peak, or when overshooting occurs, performs waveform shaping while achieving a high switching speed.

The features of the current driver circuit 10 according to the present invention will now be discussed.

(1) The current driver circuit 10 operates the damping circuits 23, 24 when the output current Io overshoots and thus restricts the current value. Thus, a high switching speed of the driver circuit 10 is achieved, while smoothly controlling the waveform of the output current.

(2) The pulse widths of the first and second damping control signals SP1, SP2 (the delay time t2 illustrated in FIG. 7) are set at a predetermined value that is appropriate for decreasing overshooting of the output current Io. That is, the damping control signals SP1, SP2 operate the damping circuits 23, 24 for a period corresponding to the overshooting. Thus, waveform shaping of the output current Io may be performed accurately, and the desired current Io flows to the load circuit 14 after damping is completed.

(3) The damping circuits 23, 24 remain deactivated from when a transition occurs in the output current Io to when the delay time t1 elapses. Thus, the output current Io rises and falls at a high speed. In other words, the switching speed of the current driver circuit 10 is prevented from being slowed. Accordingly, waveform shaping of the output current Io is performed while achieving a high switching speed.

(4) In the present embodiment, the delay times t1, t2 are set in accordance with the timing at which the output current Io overshoots. This facilitates circuit design in comparison to the prior art.

(5) In the HDD device, the magnetic flux may alter and reverse the magnetization direction when the output current overshoots. However, in the present embodiment, overshooting of the output current Io is inhibited. Thus, the load circuit 14, or the write magnetic head, guarantees correct recording of data.

It should be apparent to those skilled in the art that the present invention may be embodied in many other specific forms without departing from the spirit or scope of the invention. Particularly, it should be understood that the present invention may be embodied in the following forms.

Figure 8:
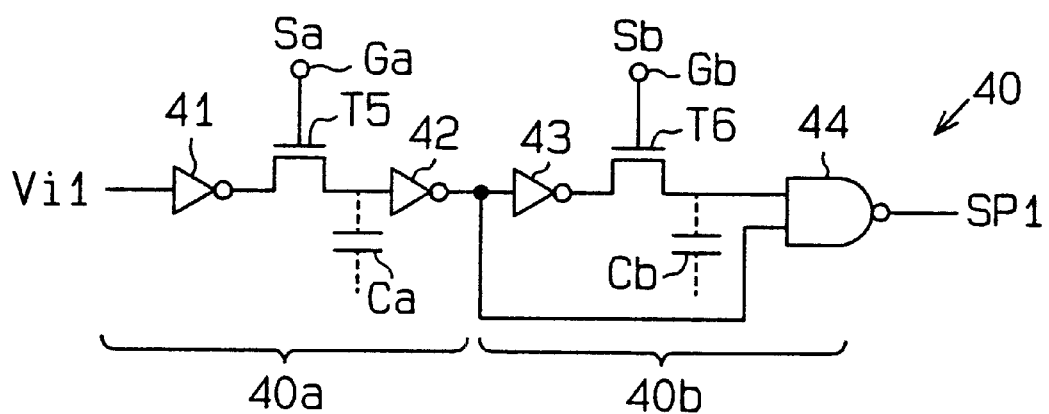
FIG. 8 is a schematic circuit diagram showing first and second damping control pulse generation circuits according to a second embodiment of the present invention.

(a) With reference to FIG. 8, the first and second damping control circuits 21, 22 may each be replaced by a damping control circuit 40.

Each of the damping control circuits 40 includes a pulse delay circuit 40a and a pulse generation circuit 40b. The pulse delay circuit 40a has two inverter circuits 41, 42 and an n-channel MOS transistor T5. The pulse delay circuit 40a delays the first input signal Vi1 (or the second input signal Vi2) and provides the delayed first input signal Vi1 (or the second input signal Vi2) to the pulse generation circuit 40b. The NMOS transistor T5 has a gate terminal Ga, which is provided with a control signal Sa having a predetermined voltage, and is constantly activated. Accordingly, the time constant is determined by the ON resistance of the transistor T5 and the parasitic capacitance Ca of the line. That is, the delay time t1 of the pulse delay circuit 40a is determined by the delaying operation of the inverter circuits 41, 42 and the transistor T5. It is preferred that the voltage level of the control signal Sa be changed to control the time constant and adjust the delay time t1.

The pulse generation circuit 40b includes an inverter circuit 43, an n-channel MOS transistor T6, and a NAND circuit 44. The NAND circuit 44 has a first input terminal provided with the delayed first input signal Vi1 (or the delayed second input signal Vi2) from the pulse delay circuit 40a via the inverter 43 and the transistor T6. The NMOS transistor T6 has a gate terminal Gb, which is provided with a control signal Sb having a predetermined voltage, and is constantly activated. Accordingly, the time constant is determined by the ON resistance of the transistor T6 and the parasitic capacitance Cb of the line. That is, the delay time t2 of the pulse generation circuit 40b is determined by the delaying operation of the inverter circuit 43 and the transistor T6.

With reference to FIG. 7, the damping control circuits 40 corresponding to the first and second damping control circuits 21, 22 output the control signals SP1, SP2 in response to the input signals Vi1, Vi2, respectively. As a result, the damping circuits 23, 24 are activated when overshooting occurs.

Further, when the timing of the overshooting of the output current Io changes due to external factors, such as temperature fluctuations, the voltage of the control signals Sa, Sb may be varied in accordance with the timing change to activate the damping circuits 23, 24 at an appropriate timing. That is, waveform shaping at the optimal timing is enabled.

In the damping control circuit 40, the gate terminal Ga of the transistor T5 corresponds to a pulse delay control terminal and the gate terminal Gb of the transistor T6 corresponds to a pulse width control terminal.

(b) The delay time t1 and t2 may be controlled by changing the size of the transistors T3, T4 in the first and second damping circuits 23, 24 or the resistance of the resistors R10, R11.

(c) The delay time t1 and t2 may also be controlled by changing the signal level (voltage) of the switching signals (first and second damping control signals) SP1, SP2 of the MOS transistors in the first and second damping circuits 23, 24. For example, the low level voltage of the switching signals SP1, SP2 of the PMOS transistors T3, T4 may be changed. In this case, the ON resistance of the transistors T3, T4 changes and the ON resistance decreases as the low level voltage becomes closer to zero volts.

To change the low level of the signals SP1, SP2, for example, the size of the PMOS and NMOS transistors in the NAND circuit 37 of the pulse generation circuits 21b, 22b may be changed. In this case, the driving capability relative to the load of the transistors may be varied to control the rising and falling time of the signals SP1, SP2 and control the waveform of the signals SP1, SP2 including the voltage level.

(d) NMOS transistors may be used in lieu of the PMOS transistors T3, T4 of the respective damping circuits 23, 24. In this case, the damping control circuits 21, 22 generate the high pulse signals (first and second damping control signals) SP1, SP2 during transition of the input signals Vi1, Vi2 for a predetermined time. More specifically, for example, the NAND circuits 37, 44 of the pulse generation circuits 21b, 22b, 40b may be replaced by NOR circuits. The first and second damping control signals SP1, SP2 generated in synchronism with the transition of the input signals Vi1, Vi2 activates the NMOS transistor by a predetermined time and decreases the flyback voltage at the output terminals OUT1, OUT2. This decreases overshooting of the output current Io.

(e) The resistors R10, R12 of the first and second damping circuits 23, 24 may be deleted.

(f) The pulse delay circuits 21a, 22a of the respective first and second damping control circuits 21, 22 may be deleted. However, it is preferred that the pulse delay circuits 21a, 22a be employed to increase the operational speed when the input signals Vi1, Vi2 rise and fall.

(g) The present invention may be applied to a driver circuit which drives the inductive load with a single input signal. This also decreases overshooting of the output current Io that occurs during transition of the input signal.

The present examples and embodiments are to be considered as illustrative and not restrictive, and the invention is not to be limited to the details given herein, but may be modified within the scope and equivalence of the appended claims.

What is claimed is:

1. A current driver circuit for receiving an input signal and for current driving a load in accordance with the input signal, comprising:

a drive circuit for supplying the load with current;

a damping circuit connected to the drive circuit for restricting the current supplied to the load from the drive circuit in accordance with a pulse signal; and a damping control circuit connected to the damping circuit for receiving the input signal, generating the pulse signal in response to the input signal and providing the pulse signal to the second damping circuit;

wherein the input signal undergoes a transaction, and the damping control circuit includes a pulse generation circuit for generating the pulse signal, which has a predetermined pulse width, in synchronism with the transition of the input signal.

2. The current driver circuit according to claim 1, wherein the damping control circuit further includes a pulse delay circuit connected to the pulse generation circuit for delaying the input signal by a predetermined time and providing the delayed input signal to the pulse generation circuit.

3. The current driver circuit according to claim 2, wherein the pulse delay circuit adjusts the predetermined time in accordance with a control signal.

4. The current driver circuit according to claim 1, wherein the pulse generation circuit adjusts the pulse width of the pulse signal in accordance with a control signal.

5. The current driver circuit according to claim 1, wherein the damping circuit includes a resistor and a switch element connected in series between any one of a high potential power supply and a low potential power supply and a node between the drive circuit and the load, the switch element being responsive to the pulse signal.

6. A differential current driver circuit for receiving first and second input signals and for current driving a load in accordance with the first and second input signals, comprising:

a first drive circuit for supplying the load with a first current;

a first damping circuit connected to the first drive circuit for restricting the first current supplied to the load from the first drive circuit in accordance with a first pulse signal;

a first damping control circuit connected to the first damping circuit for receiving the first input signal, generating the first pulse signal in response to the first input signal, and providing the first pulse signal to the first damping circuit;

a second drive circuit for supplying the load with a second current;

a second damping circuit connected to the second drive circuit for restricting the second current supplied to the load from the second drive circuit in accordance with a second pulse signal; and a second damping control circuit connected to the second damping circuit for receiving the second input signal, generating the second pulse signal in response to the second input signal, and providing the second pulse signal to the second damping circuit;

wherein the first and second input signals each undergoes a transition, the first damping control circuit includes a first pulse generation circuit for generating the first pulse signal, which has a predetermined pulse width, in synchronism with the transition of the first input signal, and the second damping control circuit includes a second pulse generation circuit for generating the second pulse signal, which has a predetermined pulse width, in synchronism with the transition of the second input signal.

7. The current driver circuit according to claim 6, wherein the first damping control circuit further includes a first pulse delay circuit connected to the first pulse generation circuit for delaying the first input signal by a predetermined time and providing the delayed first input signal to the first pulse generation circuit, and the second damping control circuit further includes a second pulse delay circuit connected to the second pulse generation circuit for delaying the second input signal by a predetermined time and providing the delayed second input signal to the second pulse generation circuit.

8. The current driver circuit according to claim 7, wherein the first and second pulse delay circuits each adjust the predetermined time in accordance with a control signal.

9. The current driver circuit according to claim 6, wherein the first and second pulse generation circuits each adjusts the pulse width of the pulse signal in accordance with a control signal.

10. The current driver circuit according to claim 6, wherein the first damping circuit includes a first resistor and a first switch element connected in series between any one of a high potential power supply and a low potential power supply and a node between the first drive circuit and the load, the first switch element being responsive to the first pulse signal, and wherein the second damping circuit includes a second resistor and a second switch element connected in series between any one of a high potential power supply and a low potential power supply and a node between the second drive circuit and the load, the second switch element being responsive to the second pulse signal.

* * * * *